(12) United States Patent
He et al.

(10) Patent No.: US 7,999,711 B1
(45) Date of Patent: Aug. 16, 2011

(54) TRANSMITTER DIGITAL-TO-ANALOG CONVERTER WITH NOISE SHAPING

(75) Inventors: Runsheng He, Sunnyvale, CA (US); Haoli Qian, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/844,862

(22) Filed: Jul. 28, 2010

Related U.S. Application Data

(63) Continuation of application No. 12/283,841, filed on Sep. 16, 2008, now Pat. No. 7,773,017, which is a continuation of application No. 11/526,485, filed on Sep. 25, 2006, now Pat. No. 7,425,910.

(60) Provisional application No. 60/777,158, filed on Feb. 27, 2006.

(51) Int. Cl.
*H03M 3/00* (2006.01)

(52) U.S. Cl. ........ 341/143; 341/118; 341/120; 341/144; 341/155

(58) Field of Classification Search .................. 341/143, 341/144, 155, 118, 120
See application file for complete search history.

(56) References Cited

U.S. PATENT DOCUMENTS

| | | | |
|---|---|---|---|
| 4,467,316 A | 8/1984 | Musmann et al. ............. 341/144 |
| 5,057,840 A | 10/1991 | Ledzius et al. ................. 341/144 |
| 5,311,181 A | 5/1994 | Ferguson et al. ............. 341/143 |
| 5,369,403 A * | 11/1994 | Temes et al. ................... 341/143 |
| 5,404,142 A | 4/1995 | Adams et al. |
| 5,424,739 A | 6/1995 | Norsworthy et al. |
| 5,602,583 A | 2/1997 | Citta |
| 5,881,108 A | 3/1999 | Herzberg et al. |
| 6,005,505 A * | 12/1999 | Linz .............................. 341/143 |
| 6,051,884 A | 4/2000 | Papadas et al. |
| 6,100,591 A | 8/2000 | Ishii |
| 6,104,369 A | 8/2000 | Inamori et al. |
| 6,178,082 B1 | 1/2001 | Farooq |
| 6,400,761 B1 | 6/2002 | Smee et al. |
| 6,404,369 B1 | 6/2002 | Sheen ........................... 341/143 |
| 6,411,657 B1 | 6/2002 | Verbin et al. |
| 6,448,510 B1 | 9/2002 | Neftin et al. |
| 6,452,524 B1 | 9/2002 | Fraleigh et al. ............... 341/143 |
| 6,477,034 B1 | 11/2002 | Chakravorty |
| 6,486,557 B1 | 11/2002 | Davis et al. |
| 6,577,259 B1 | 6/2003 | Jelonnek ........................ 341/143 |
| 6,680,978 B1 | 1/2004 | Schneider et al. |
| 6,741,123 B1 | 5/2004 | Andersen et al. ................ 330/10 |
| 6,792,049 B1 | 9/2004 | Bao et al. |
| 6,809,669 B1 * | 10/2004 | Robinson ....................... 341/131 |
| 6,888,484 B2 | 5/2005 | Kiss et al. ...................... 341/143 |
| 6,980,144 B1 | 12/2005 | Maloberti et al. ............. 341/143 |

(Continued)

OTHER PUBLICATIONS

"Combined Equalization and Coding Using Precoding", by G. David Forney, Jr., and M. Vedat Eyuboglu—IEEE Communications Magazine—Dec. 1991. pp. 25-34.

(Continued)

*Primary Examiner* — Linh V Nguyen

(57) ABSTRACT

A noise-shaping module including a first addition module configured to receive a digital input signal and a filtered output signal. A truncation module is configured to remove selected bits from the digital input signal and output a truncated output signal. The truncated output signal corresponds to the digital input signal with the selected bits removed. A second addition module is configured to output a difference signal. The difference signal is based on a difference between the digital input signal and the truncated output signal. A filter module is configured to generate the filtered output signal based on the difference signal and provide the filtered output signal to the first addition module.

13 Claims, 8 Drawing Sheets

U.S. PATENT DOCUMENTS

| | | | |
|---|---|---|---|
| 7,119,726 B2 | 10/2006 | Wang | |
| 7,138,935 B1 | 11/2006 | Damphousse et al. | 341/144 |
| 7,142,125 B2 * | 11/2006 | Larson et al. | 340/635 |
| 7,143,125 B2 | 11/2006 | Gradishar et al. | |
| 7,196,647 B2 | 3/2007 | Melanson | |
| 7,200,180 B2 | 4/2007 | Verbin et al. | |
| 7,253,758 B2 | 8/2007 | Chang et al. | 341/143 |
| 7,425,910 B1 | 9/2008 | He et al. | |
| 7,436,337 B1 | 10/2008 | He et al. | |
| 7,471,225 B1 | 12/2008 | He et al. | |
| 7,773,017 B1 * | 8/2010 | He et al. | 341/143 |
| 2001/0045670 A1 | 11/2001 | Nojiri | |
| 2002/0076851 A1 | 6/2002 | Eden et al. | |
| 2002/0153609 A1 | 10/2002 | Kaneko et al. | |
| 2004/0190728 A1 * | 9/2004 | Melanson | 381/71.8 |
| 2004/0233086 A1 * | 11/2004 | Kiss et al. | 341/143 |
| 2005/0123078 A1 * | 6/2005 | Felbach | 375/344 |
| 2005/0192800 A1 | 9/2005 | Thyssen | |
| 2006/0020649 A1 * | 1/2006 | Dai | 708/271 |
| 2006/0164272 A1 | 7/2006 | Philips et al. | 341/143 |
| 2007/0014345 A1 | 1/2007 | Gu et al. | |
| 2007/0241950 A1 | 10/2007 | Petilli et al. | 341/143 |
| 2008/0122529 A1 * | 5/2008 | Bagheri et al. | 327/552 |
| 2008/0180292 A1 | 7/2008 | Magrath | |

OTHER PUBLICATIONS

"Matched-Transmission Technique for Channels with Intersymbol Interference", by Hiroshi Harashima and Hiroshi Miyakawa, Member, IEEE.—IEEE Transactions on Communications, vol. COM-20, No. 4, Aug. 1972. pp. 774-779.

USPTO Non-Final Office Action mailed Sep. 12, 2007 for U.S. Appl. No. 11/526,485, filed Sep. 25, 2006.

Amendment filed Dec. 12, 2007 in response to USPTO Non-Final Office Action mailed Sep. 12, 2007 for U.S. Appl. No. 11/526,485, filed Sep. 25, 2006.

* cited by examiner

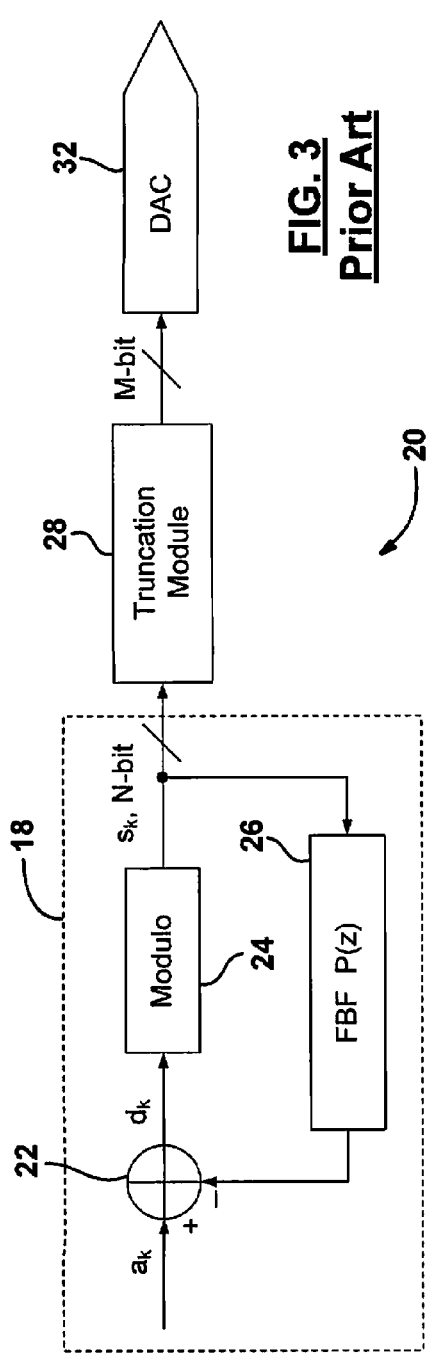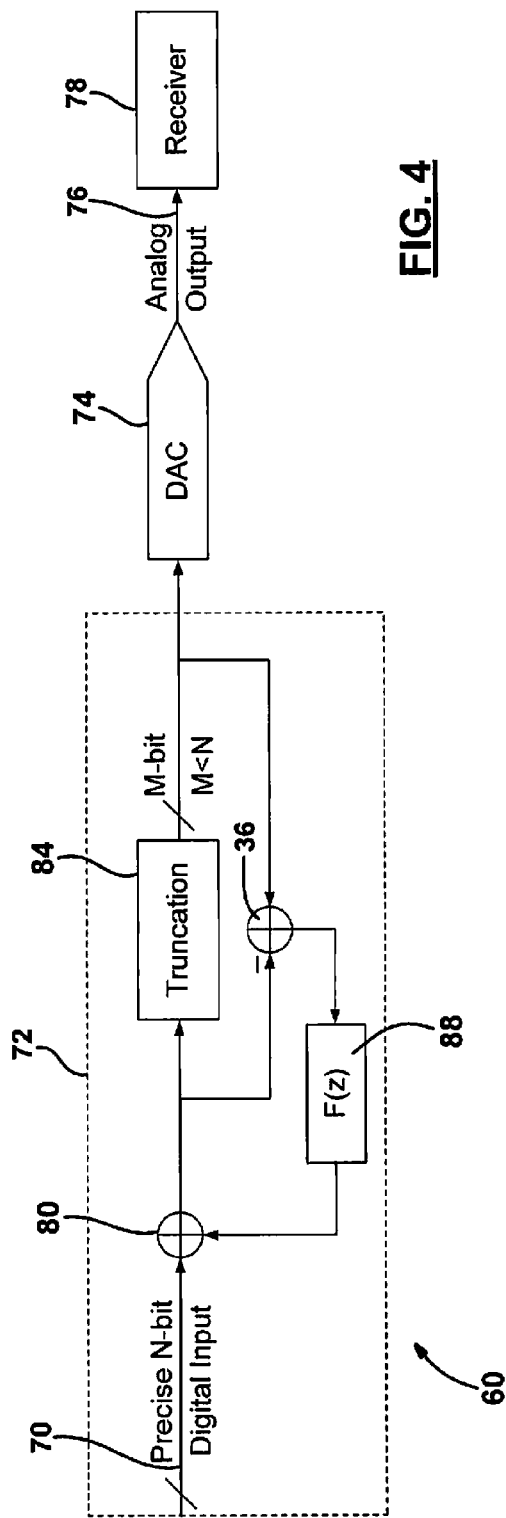

US 7,999,711 B1

TRANSMITTER DIGITAL-TO-ANALOG CONVERTER WITH NOISE SHAPING

CROSS-REFERENCE TO RELATED APPLICATIONS

This application is a continuation of U.S. patent application Ser. No. 12,283,841, filed Sep. 16, 2008, which is a continuation of U.S. patent application Ser. No. 11/526,485 (now U.S. Pat. No. 7,425,910), filed Sep. 25, 2006, which claims the benefit of U.S. Provisional Application No. 60/777,158, filed Feb. 27, 2006. The disclosures of the above applications are incorporated herein by reference.

FIELD

The present invention relates to systems and methods for transmitting signals to a receiver, and, more specifically, to systems and methods for controlling noise levels from a transmitter digital-to-analog converter.

BACKGROUND

In various communication systems, digital-to-analog converters are used to convert digital signals to analog signals before transmission. Digital-to-analog converters may introduce quantization noise into the analog signals—particularly when a large number of signal levels are used. Examples of techniques that utilize a large number of output levels include Tomlinson-Harashima-Precode and advance modulation schemes such as OFDM and discreet multi-tone modulation.

Typically, to reduce the effect of quantization noise on system performance, a power spectrum density (PSD) level of the quantization noise should be below a predetermined PSD level of unavoidable noises. A typical requirement is for the quantization noise to have a PSD that is 10 decibels below the PSD of unavoidable noises. Examples of unavoidable noises include additive white Gaussian noise (AWGN), alien crosstalk from other cables or transmitters and quantization noise of the analog to digital converter at the receiver.

Conventional digital-to-analog converter designs produce a quantization noise with a white PSD evenly distributed among all frequency components. However, the communication system performance is often limited by a worst case channel. The frequency response of this channel varies significantly within the transmission bandwidth. As a result, the quantization noise from the transmitter digital-to-analog converter may be shaped by the channel and observed by the receiver.

The peak of the quantization noise PSD (shaped by the channel) observed by the receiver must be lower than other noises by a predetermined level. As a result, a large number of bits may be required for the digital-to-analog converter input and the digital-to-analog converter size and complexity are increased. Reducing the size and complexity of a digital-to-analog converter would lower the overall cost of the system.

Referring now to FIG. 1, a transmitter 8 having an input 10 from an advance modulation scheme or a pre-coding scheme is illustrated. The input 10 generates an N-bit digital input to a truncation module 12. The truncation module 12 truncates the N-bit signal to an M-bit signal, where M is an integer less than N. The truncation module 12 eliminates the least significant bits from the N-bit digital input signal. The M-bit signal is provided to a digital-to-analog converter 14 where it is converted to an analog output signal corresponding to the M-bit signal.

Referring now to FIG. 2, a signal model illustrating the input signal $a_n$, which corresponds to the output of the truncation module 12, is summed with truncation noise $q_n$ at a summing module 16. The truncation noise $q_n$ is inherent in the truncation module 12. The truncation noise is sometimes referred to as quantization noise.

Referring now to FIG. 3, a 10GBASE-T transmitter 20 having a pre-coder 18 is illustrated. An input signal $a_k$ is provided to a summing module 22, the addition module 22 generates a summed signal $d_k$ as will be described below. The signal $d_k$ is provided to a modulo operation module 24 where it is converted to a signal $s_k$ that has N-bits. Feedback of the signal $s_k$ is provided through a feedback filter 26 having a transfer function P(z). The output of the feedback filter 26 is provided to the addition module 22. Referring back to modulo operation module 24, the N-bit signal, $s_k$ is provided to the truncation module 28, which truncates the signal to an M-bit signal that is provided to the digital-to-analog converter 32 conversion to an analog signal. The digital-to-analog converter 32 illustrated in FIG. 3 may be implemented with Tomlinson-Harashima-Precode (THP). The approach illustrated in FIGS. 1-3 has quantization noise problems that degrade the performance of the communication system.

SUMMARY

A noise shaping module includes a first addition module that receives a digital input signal, a first filter module that generates a first filtered output signal based on an output of the first addition module, a truncation module that generates a truncated output signal based on the first filtered module. A second filter module that generates a second filtered output based on the truncated output signal. The second filtered output signal is an input to the first addition module.

A feature of the noise shaping module is that it may be incorporated into a system that includes a digital-to-analog converter module that converts the truncated output signal to an analog signal. The system may also communicate the analog signal of the digital-to analog converter across a communication channel.

The first filter module of the noise shaping module may also have a first transfer function and the second filter module may have a second transfer function, wherein a sum of the first transfer function and the second transfer function is approximately 1.

Another feature of the noise shaping module is that the filtered output $x_n$ is equal to $$\frac{1}{G(z) + H(z)} a_n + \frac{H(z)}{G(z) + H(z)} q_n,$$

where G(z) is the first transfer function, H(z) is the second transfer function, $q_n$ is a quantization noise from the truncation module and $a_n$ is the digital input signal.

Another feature is that the noise shaping module may include a first transfer function that suppress quantization noise from the truncation module. The first transfer function may also be a function of a communication channel characteristic. The communication channel characteristic may have a first frequency band having a first attenuation level and a second frequency band having a second attenuation level that is greater than the first attenuation level. The first transfer function may suppresses a quantization noise from the truncation module more in the first frequency band than the second frequency band which may be performed so that a noise component is equalized In a frequency domain.

The communication channel may operate in accordance with 10GBASET.

In a further feature of the disclosure, a method includes receiving a digital input signal at a first addition module, filtering an output of the first addition module to form a filtered signal, truncating the filtered signal to form a truncated signal, filtering the truncated signal to form a second filtered signal, and communicating the second filtered signal to the first addition module.

Another feature of the method is that the truncated signal may be converted to an analog signal. The analog signal may be communicated across a communication channel.

Another feature of the method is filtering an output of the first addition module may be performed according to a first transfer function, and filtering the truncated signal may be performed according to a second transfer function, wherein a sum of the first transfer function and the second transfer function is approximately 1.

Another feature is that the second filtered signal $x_n$ may be equal to $$\frac{1}{G(z)+H(z)}a_n + \frac{H(z)}{G(z)+H(z)}q_n,$$

where $G(z)$ is a first transfer function, $H(z)$ is a second transfer function, $q_n$ is a quantization noise from the truncation module and $a_n$ is the digital input signal.

Another feature is that the method may include suppressing quantization noise from the truncation module with the first transfer function.

Yet another feature is that the first transfer function is a function of a communication channel characteristic. The communication channel characteristic having a first frequency band may be provided having a first attenuation level and a second frequency band having a second attenuation level that is greater than the first attenuation level. The method may also include suppressing quantization noise more in the first frequency band than the second frequency. This may be performed by using the first transfer function so that a noise component is equalized in a frequency domain.

In yet another feature of the invention, a noise shaping module includes receiving means for receiving a digital input signal at a first addition module, first filtering means for filtering an output of the first addition module to form a filtered signal, truncating means for truncating the filtered signal to form a truncated signal, second filtering means for filtering the truncated signal to form a second filtered signal, and communicating means for communicating the second filtered signal to the first addition module.

Another feature of the noise shaping module may be a converting means for converting the truncated signal to an analog signal and a communicating means for communicating the analog signal across a communication channel.

Another feature of the noise shaping module is that the first filtering means may comprise a first transfer function and second filtering means may comprise a second transfer function, wherein a sum of the first transfer function and the second transfer function is approximately 1.

Another feature is that the noise shaping module is that the second filtered signal $x_n$ may be equal to $$\frac{1}{G(z)+H(z)}a_n + \frac{H(z)}{G(z)+H(z)}q_n,$$

where $G(z)$ is the first transfer function, $H(z)$ is the second transfer function, $q_n$ is a quantization noise from the truncation module and $a_n$ is the digital input signal.

In another feature of the noise shaping module, the first transfer function may comprise means for suppressing quantization noise from the truncation module.

In yet another feature, the first transfer function of the noise shaping module may be a function of a communication channel characteristic. The communication channel characteristic may have a first frequency band having a first attenuation level and a second frequency band having a second attenuation level that is greater than the first attenuation level. The noise shaping module may include suppressing means for suppressing quantization noise from a truncation module more in the first frequency band than the second frequency. This may be performed so that a noise component is equalized in a frequency domain.

In another embodiment of the disclosure, a noise shaping module includes a first addition module that receives an input signal, a modulo operation module generates a modulo output based on an output of the addition module, a truncation module that truncates the modulo output, and a feedback filter module that generates a feedback signal that is input to the first addition module based on the truncated output.

A feature of the noise shaping module is that it may be incorporated into a system that includes a digital-to-analog converter module that converts the truncated output signal to an analog signal. The system may also communicate the analog signal of the digital-to analog converter across a communication channel.

Another feature is that the feedback filter of the noise shaping module may have a first transfer function. The first transfer function may suppress quantization noise from the truncation signal. The first transfer function may be a function of a communication channel characteristic. The communication channel characteristic comprises transmitter and receiver analog filter characteristics. The communication channel characteristic may comprise receiver feed forward equalizer characteristics.

Another feature is that the noise shaping module may include a first transfer function that suppress quantization noise from the truncation module. The first transfer function may also be a function of a communication channel characteristic. The communication channel characteristic may have a first frequency band having a first attenuation level and a second frequency band having a second attenuation level that is greater than the first attenuation level. The first transfer function may suppresses a quantization noise from the truncation module more in the first frequency band than the second frequency band which may be performed so that a noise component is equalized In a frequency domain.

In another feature of the disclosure, a method includes receiving a digital input signal at a first addition module, generating a modulated output based on an output of the addition module, truncating the modulated output to form a truncated signal, and filtering the truncated signal to generate a feedback signal that is an input to the first addition module based on truncated signal.

One feature is that the truncated signal may be converted to an analog signal. Another feature is that filtering the truncated signal may include filtering the truncated signal with a filter having a first transfer function.

Another feature is that the method may include suppressing quantization noise from the truncation signal with the first transfer function. The first transfer function may be a function of a communication channel characteristic such as a transmitter and receiver analog filter characteristics or receiver feed forward equalizer characteristics.

Another feature of the method is the method may include providing the first transfer function as a function of a communication channel having a first frequency band with a first attenuation level and a second frequency band with a second attenuation level that is greater than the first attenuation level.

Another feature is that the method may also include suppressing a quantization noise more in the first frequency band than the second frequency band with the first transfer function. This may be performed so that a noise component is equalized in a frequency domain with the first transfer function.

In yet another feature of the disclosure, a noise shaping module includes receiving means for receiving a digital input signal at a first addition module, generating means for generating a modulated output based on an output of the addition module, truncating means for truncating the modulated output to form a truncated signal, and filtering means for filtering the truncated signal to generate a feedback signal that is input to the first addition module based on the truncated signal.

Another feature of the noise shaping module may include a converting means for converting the truncated signal to an analog signal.

A feature of the filtering means may include filtering means for filtering the signal with a filter having a first transfer function.

Another feature of the noise shaping module includes may be the inclusion of suppressing means for suppressing quantization noise from the truncation module with the first transfer function.

Another feature of the noise shaping module may include providing means for providing the first transfer function as a function of a communication channel characteristic.

Another feature of the noise shaping module may include providing means for providing the communication channel characteristic as a function of transmitter and receiver analog filter characteristics.

Another feature of the noise shaping module may include providing means for providing the communication channel characteristic as a function of the receiver feed forward equalizer characteristics.

Another feature of the noise shaping module may include providing means for providing the first transfer function as a function of a communication channel having a first frequency band with a first attenuation level and a second frequency band with a second attenuation level that is greater than the first attenuation level.

Another feature of the noise shaping module may include suppressing means for suppressing quantization noise more in the first frequency band than the second frequency band with the first transfer function.

Another feature of the noise shaping module may include suppressing means for suppressing a quantization noise from the truncation module more in the first frequency band than the second frequency band so that a noise component is equalized in a frequency domain with the first transfer function.

In another embodiment of the disclosure, a noise shaping module includes a first addition module that receives a digital input signal and generates an output signal, a truncation module that generates a truncated output signal based on an output of said first addition module; and a filter module that generates a filtered output based on a combination of output signal of the first addition module and the truncated output signal of the first truncation module.

A feature of the noise shaping module is that it may be incorporated into a system that includes a digital-to-analog converter module that converts the truncated output signal to an analog signal. The system may also communicate the analog signal of the digital-to analog converter across a communication channel.

Another feature is that the first filter module may include a first transfer function. The first transfer function may be a function of a communication channel characteristic having a first frequency band with a first attenuation level and a second frequency band with a second attenuation level that is greater than the first attenuation level. The first transfer function may be is $1+F(z)$.

Another feature is that the noise shaping module may include a first transfer function that suppress quantization noise from the truncation module. The first transfer function may also be a function of a communication channel characteristic. The communication channel characteristic may have a first frequency band having a first attenuation level and a second frequency band having a second attenuation level that is greater than the first attenuation level. The first transfer function may suppresses a quantization noise from the truncation module more in the first frequency band than the second frequency band which may be performed so that a noise component is equalized In a frequency domain.

In another feature of the disclosure a method includes receiving a digital input signal at a first addition module, truncating an output of the first addition module to form a truncated signal, and filtering the combination of an output of the first addition module and an the first truncated module to form a filtered output signal, and adding the filtered output signal to the input signal.

One feature of the method includes converting the truncated output signal to an analog signal. The analog signal may then be communicated through a communication channel.

Another feature of the method includes providing the filter module with a first transfer function. The first transfer function may be a function of a communication channel having a first frequency band with a first attenuation level and a second frequency band with a second attenuation level that is greater than the first attenuation level.

Another feature of the method includes suppressing a quantization noise from the truncated signal more in the first frequency band than the second frequency band.

Another feature of the method may include suppressing a quantization noise from the truncated signal more in the first frequency band than the second frequency band so that a noise component is equalized in a frequency domain.

In a further feature of the disclosure, a noise shaping module includes receiving means for receiving a digital input signal at a first addition module, truncating means for truncating an output of the first addition module to form a truncated signal, filtering means for filtering a combination of an output of the first addition module and an output of the first truncation module to form a filtered output signal, and adding means for adding the filtered output signal to the input signal.

One feature of the noise shaping module includes means for providing the filter means with a first transfer function comprises means for providing the first transfer function as a function of a communication channel having a first frequency band with a first attenuation level and a second frequency band with a second attenuation level that is greater than the first attenuation level.

Another feature of the means for providing the first transfer function of the noise shaping module includes suppressing means for suppressing a quantization noise from a truncation means more in the first frequency band than the second frequency band.

Another feature of the means for providing the first transfer function of the noise shaping module includes suppressing means for suppressing a quantization noise from the truncation means more in the first frequency band than the second frequency band so that a noise component is equalized in a frequency domain.

BRIEF DESCRIPTION OF THE DRAWINGS

The present invention will become more fully understood from the detailed description and the accompanying drawings, wherein:

FIG. 3 is a functional block diagram of a second prior art transmitter design.

FIG. 4 is a functional block diagram of a transmitter design according to a first embodiment of the present disclosure.

DETAILED DESCRIPTION

Figure 1:
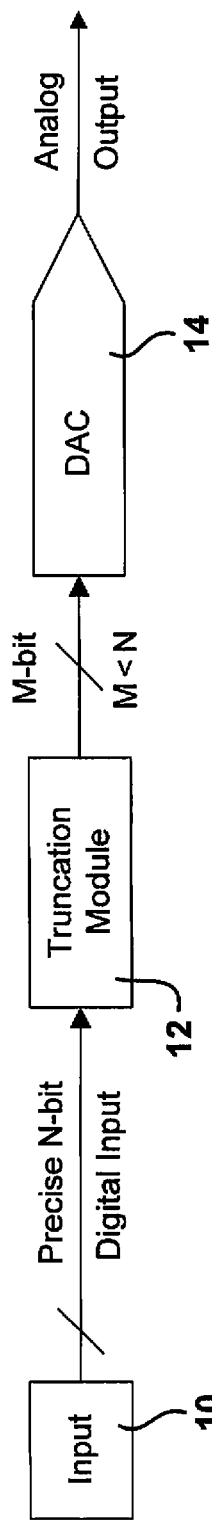
FIG. 1 is a functional block diagram of a prior art transmitter.
Figure 2:
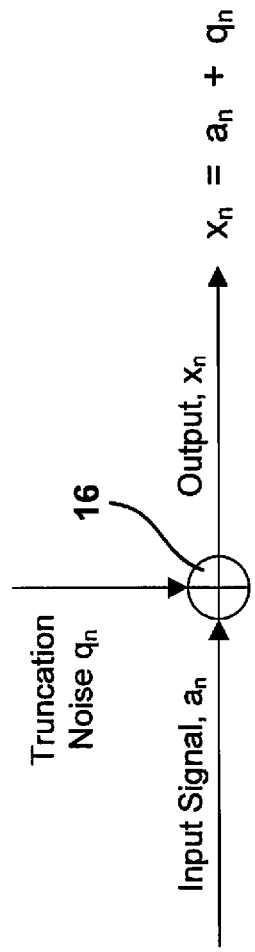
FIG. 2 is a signal model of the transmitter of FIG. 1.

The following description of the preferred embodiment(s) is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

The present disclosure provides a system for use with a transmitter. The transmitter may be any type of transmitter including wired transmitters, wireless transmitters, and various other types of transmitters.

Referring now to FIG. 4, a transmitter module 60 is illustrated having an input 70. Input 70 may provide an input from an advanced modulation scheme or a pre-coding scheme as described above. The input 70 provides an N-bit digital input to a noise-shaping module 72. The noise-shaping module 72 provides an M-bit signal to a digital-to-analog converter module 74 that provides an analog output to a communication channel 76. The communication channel 76 provides the analog signal to a receiver 78. The communication channel 76 may be a two-way channel as will be described below.

Noise-shaping module 72 includes a first addition module 80 and a truncation module 84. A second addition module 86 receives an output of the truncation module 84 and the input of the truncation module 84 or output of the first addition module 80 and provides the difference to a first filter module 88. The first filter module has a transfer function F(z). The output of the first filter module is communicated to the addition module 80. The output of the truncation module 84 is an M-bit signal, where M is an integer less than N. The truncation module 84 removes the least significant bit or bits from the N-bit digital input. The output of the truncation module 84 is fed to the digital-to-analog converter 74.

The signal through the noise shaping circuit is undistorted, while the quantization noise added by the truncation module 84 is passed to the digital-to-analog converter with an overall transfer function of 1+F(z).

From the receiving end, a channel processed version of the output signal $x_n$ and the digital-to-analog converter quantization noise is given by $C(z)*(1+F(z))*q_n$, where $C(z)$ is the transfer function of the communication channel. The transfer function F(z) may vary depending on the particular system to which the present invention is applied. F(z) is designed so that the quantization noise $q_n$ is suppressed in the frequency band where the attenuation of C(z) is small, and less in the frequency band where C(z)'s attenuation is large. At the receiving end, the digital-to-analog converter quantization noise component is equalized in the frequency domain and has a much smaller power compared to the receiving quantization noise power with the same bit number conventional digital-to-analog converter implemented at the transmitter.

Figure 5:
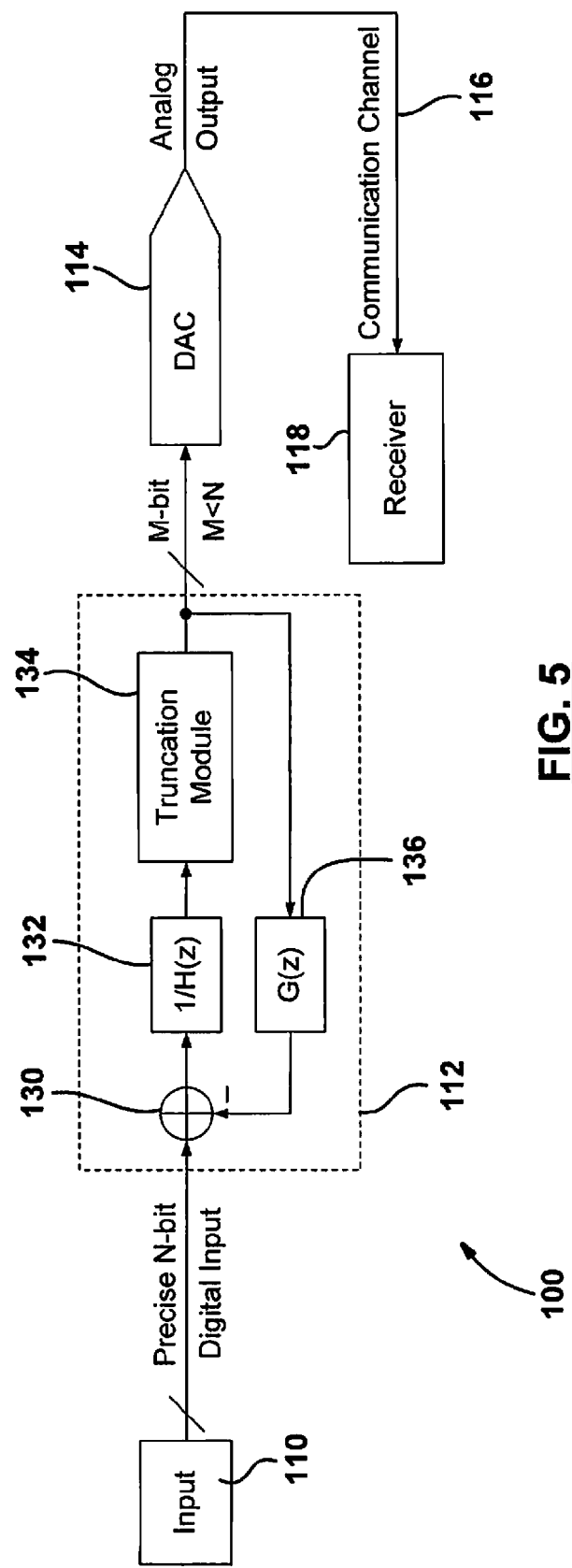
FIG. 5 is a functional block diagram of a transmitter design according to a second embodiment of the present disclosure.

Referring now to FIG. 5, a transmitter module 100 is illustrated having an input 110. Input 110 may provide an input from an advanced modulation scheme or a pre-coding scheme as described above. The input 110 provides an N-bit digital input to a noise-shaping module 112. The noise-shaping module 112 provides an M-bit signal to a digital-to-analog converter module 114 that provides an analog output to a communication channel 116. The communication channel 116 provides the analog signal to a receiver 118. The communication channel 116 may be a two-way channel as will be described below.

Noise-shaping module 112 includes an addition module 130, a first filter module 132, a truncation module 134, and a second filter module 136. The addition module 130 sums the output of the second filter module 136 and the N-bit digital input 110. The N-bit digital input 110 with feedback from the second filter module 136 is communicated through the first filter module 132. The first filter module 132 has a transfer function H(z) that is a function of the communication channel. The digital output of the filter module 132 is communicated to the truncation module 134. The output of the truncation module 134 is an M-bit signal, where M is an integer less than N. The truncation module 134 removes the least significant bit or bits from the N-bit digital input. The output of the truncation module 134 is communicated to the digital-to-analog converter 114. The output of the truncation module 134 is also provided to the second filter 136.

Figure 6:
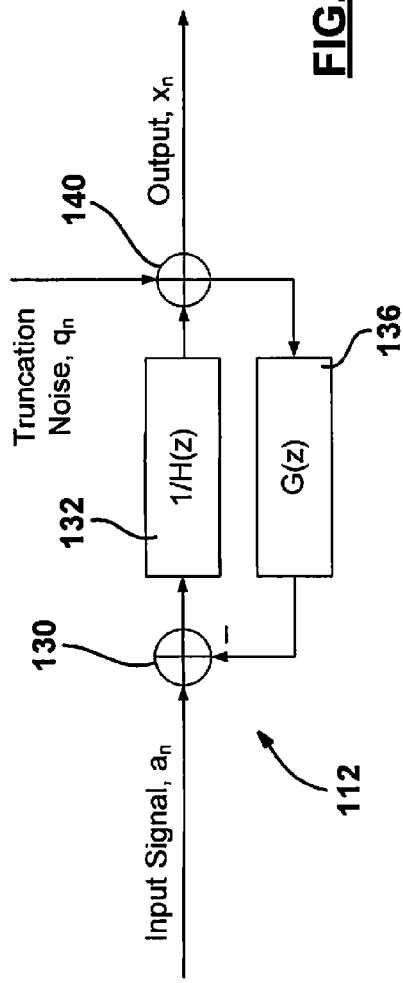
FIG. 6 is a signal model of the block diagram of FIG. 4.

Referring now to FIG. 6, a signal model of the noise-shaping module 112 of FIG. 5 is set forth. The digital input to the addition module 130 is set forth as input signal $a_n$. The first filter 132 and the second filter 136 have the transfer functions described above. However, the output of the noise-shaping module 112 also includes truncation noise denoted by the signal $q_n$. The truncation noise is inherent in the truncation module 134. Minimizing the effect of the truncation noise on the receiver is a desired goal of the disclosure. The truncation noise is illustrated by the signal $q_n$ provided to an addition module 140. The addition module 140 is part of the signal model and not part of the physical device. The output signal is denoted by $x_n$. Thus, the output signal $x_n$ is equal to $$x_n = \frac{1}{G(z)+H(z)}a_n + \frac{H(z)}{G(z)+H(z)}q_n,$$

It should be noted that the signal $a_n$ may be passed through noise-shaping module 112 undistorted when $H(z)+G(z)=1$. When the above conditions are satisfied, the noise component in the output signal $x_n$ is given by $H(z)*q_n$. Therefore, the transfer function $H(z)$ controls the frequency of the digital-to-analog converter quantization noise $q_n$.

From the receiving end, a channel process version of this output signal $x_n$ and the digital-to-analog converter quantization noise is given by $C(z)*H(z)*q_n$, where $C(z)$ is the transfer function of the communication channel. The transfer functions $G(z)$ and $H(z)$ may vary depending on the particular system to which the present invention is applied. $H(z)$ is designed so that the quantization noise $q_n$ is suppressed in the frequency band where $C(z)$'s attenuation is small, and less in the frequency band where $C(z)$'s attenuation is large. At the receiving end, the digital-to-analog converter quantization noise component is equalized in the frequency domain and has a much smaller power compared to the receiving quantization noise power with the same bit number conventional digital-to-analog converter implemented at the transmitter.

The present disclosure utilizes knowledge of the communication channel frequency response in the transmitter digital-to-analog converter design. The first filter 132 and second filter 136 are designed to closely match the channel frequency's response so that the receiver side digital-to-analog converter quantization noise peak is minimized.

It should be noted that over-sampling is unnecessary to perform noise shaping although it may be used. The noise shaping provided in the present disclosure is within the signal band so that the receiver end quantization noise is equalized. It should also be noted that the digital filters may be implemented at the symbol rate.

Figure 7:
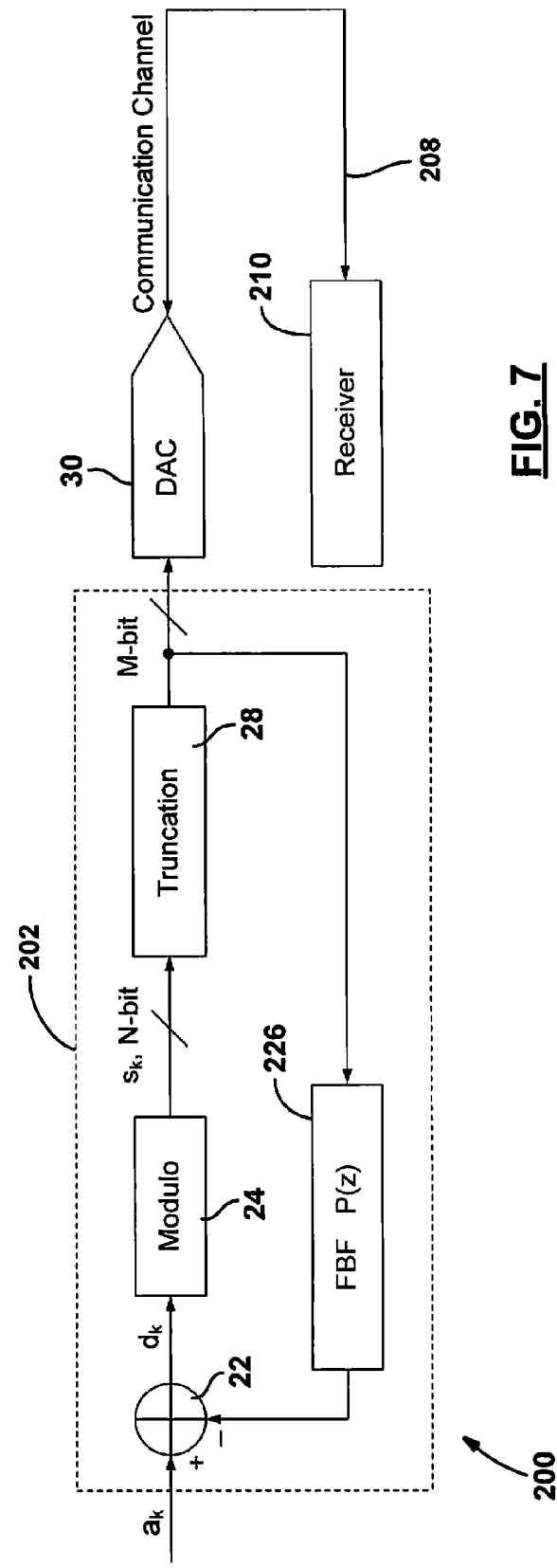
FIG. 7 is a functional block diagram of a third transmitter according to the present disclosure.

Referring now to FIG. 7, a 10GBASE-T transmitter 200 having a noise-shaping module 202 is illustrated. FIG. 7 is provided in contrast to FIG. 3. That is, FIG. 7 has feedback provided in a different location and a different feedback transfer function than the circuit of FIG. 3. In this embodiment, the feedback filter has a transfer function P(z) with similar goals to the first filter and second filter described above in FIGS. 5 and 6. The 10GBASE-T standard adopts the Tomlinson-Harashima-Precoding (THP) configuration in which coefficients are exchanged between a receiver 210 and the transmitter 200 using a two-way communication channel 208. This allows the transfer function P(z) of the feedback filter 226 to match the channel characteristics combined with the transmitter/receiver analog filters and receiver feed forward equalizer. The transfer function P(z) will vary depending upon the particular system to which it is applied.

The output of the feedback filter 226 is communicated to addition module 22. The output of the addition module 22 is communicated to the modulo operation module 24 in a similar manner to FIG. 3 above. The output of the modulo operation module 24, $s_k$, is communicated to truncation module 28. The truncated M-bit signal is communicated to digital-to-analog converter 30 and to feedback filter 226. The output of the digital-to-analog converter 30 is provided to the receiver 210.

As mentioned above, the receiver 210 may communicate with the transmitter 200 to provide the coefficients and characteristics through communication channel 208. After exchanging the characteristics, the transfer function P(z) may be formed. The transfer function may be formed once for a particular system or many times for a system that may be coupled to various types of receivers or various communications that may have various communication channel characteristics such as different cable lengths. Often times, such a system may be designed for the worst case characteristic such as the longest cable length.

According to THP configuration, P(z) is automatically adjusted such that $C(z)/(1+P(z))$ is equalized. Hence, $1/(1+P(z))$ is the desired transfer function by which the truncation quantization noise shall be shaped.

The module 202 shapes the truncation noise by $1/(1+P(z))$. And the receiving end truncation noise is minimized.

It should also be noted that a similar configuration to that described with respect to FIGS. 4, 5 and 6 may be adopted in a 10GBASE-T transmitter. However, because the feedback filter is provided, a simpler, more attractive structure is utilized as set forth in FIG. 7.

Figure 8A:
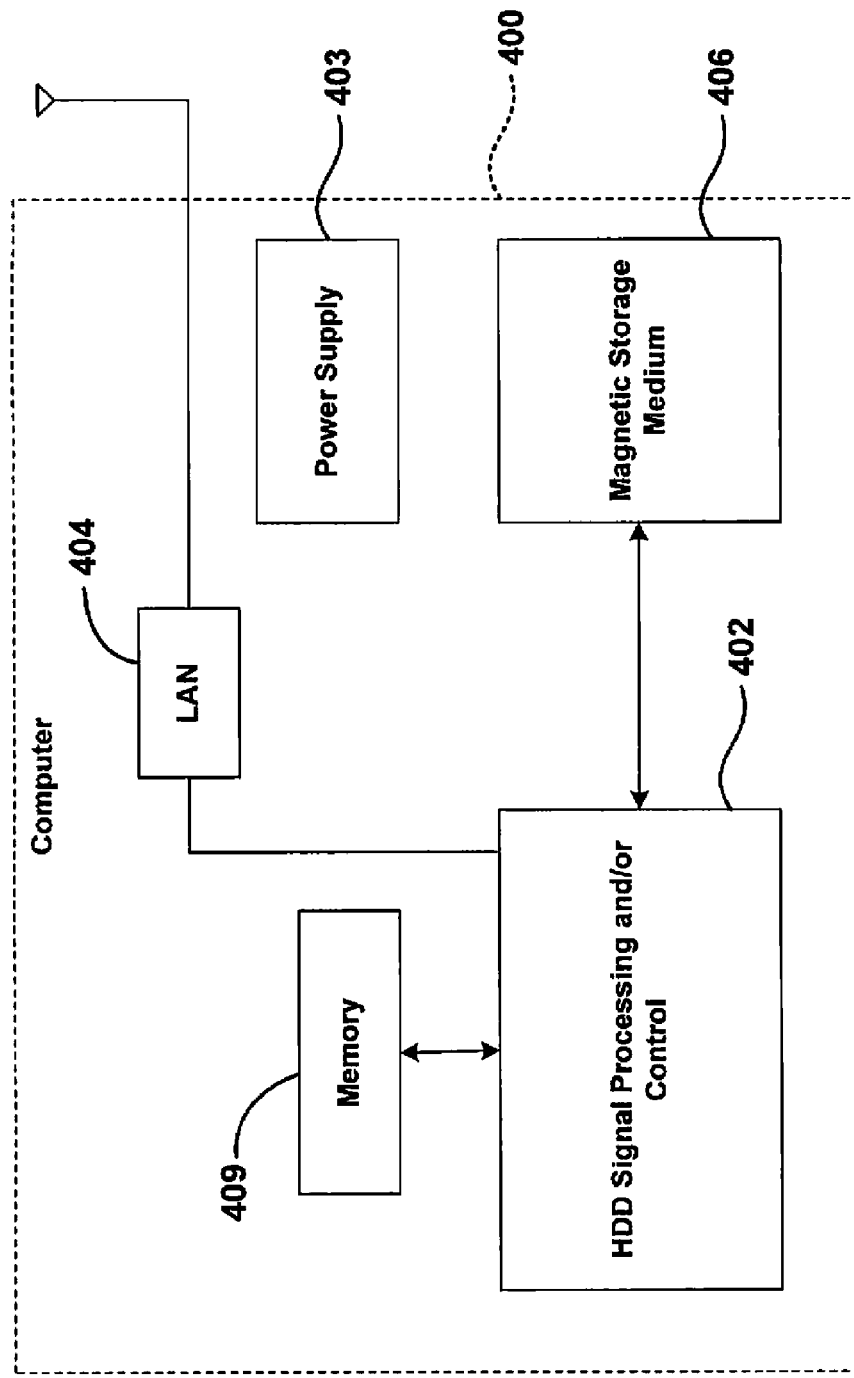
FIG. 8A is a functional block diagram of a computing device.

Referring now to FIGS. 8A-8F, various exemplary implementations of the device are shown. Referring now to FIG. 8A, a computer device 400 is illustrated. The device may implement and/or be implemented in a transmitter DAC of a local area network (LAN) transmitter 404. In some implementations, the signal processing and/or control circuit 402 and/or other circuits (not shown) in the computer device 400 may process data, perform coding and/or encryption, perform calculations, and/or format data that is output to and/or received from a magnetic storage medium 406. As illustrated, the transmitter may be part of a LAN transmitter 404. The LAN transmitter 404 may be wired or wireless.

The computer device 400 may be connected to memory 409 such as random access memory (RAM), low latency nonvolatile memory such as flash memory, read only memory (ROM) and/or other suitable electronic data storage.

Figure 8C:
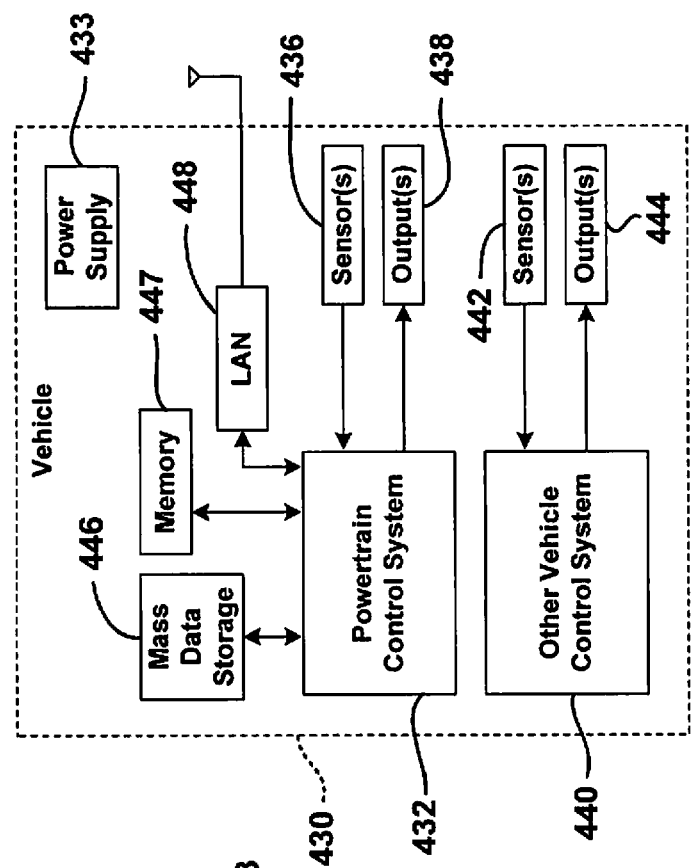
FIG. 8C is a functional block diagram of a vehicle control system.
Figure 8B:
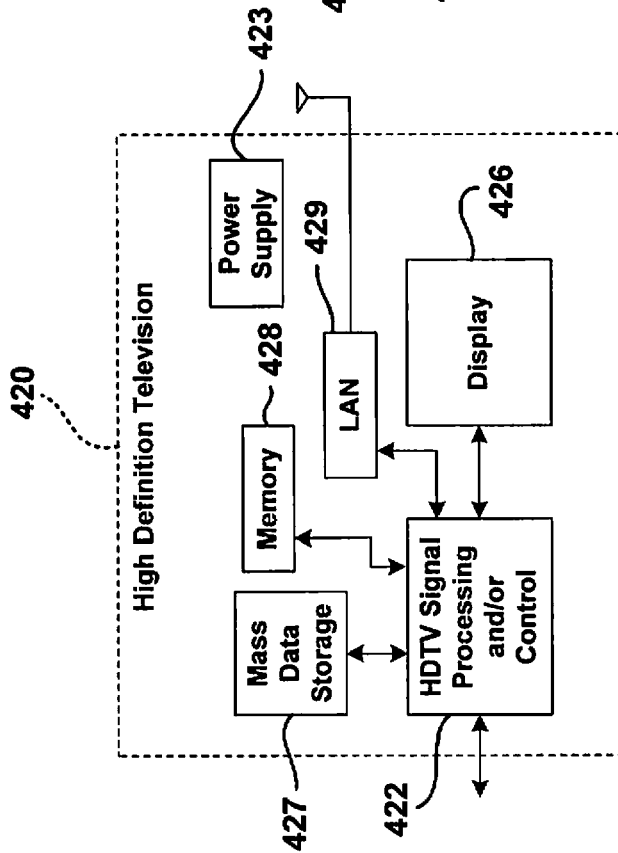
FIG. 8B is a functional block diagram of a high definition television.

Referring now to FIG. 8B, the device can be implemented in a transmitter of a wireless or wired LAN 429 of a high definition television (HDTV) 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with a mass data storage 427 that stores data in a nonvolatile manner such as optical and/or magnetic storage devices. The HDTV 420 may be connected to memory 428 such as RAM, ROM, low latency nonvolatile memory such as flash memory and/or other suitable electronic data storage. The HDTV 420 may support connections with a LAN via a LAN network interface 429 utilizing the transmitter capabilities described above. The LAN network interface 429 may be wireless or wired.

Referring now to FIG. 8C, the device may be implemented in a wired or wireless WLAN interface 440 of a control system of a vehicle 430. In some implementations, the device may be implemented in a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The control system 440 may likewise receive signals from input sensors 442 and/or output control signals to one or more output devices 444. In some implementations, the control system 440 may be part of an anti-lock braking system (ABS), a navigation system, a vehicle telematics system, a lane departure system, an adaptive cruise control system, a vehicle entertainment system such as a stereo or video system, and the like. Still other implementations are contemplated.

The powertrain control system 432 may also communicate with mass data storage 446 that stores data in a nonvolatile manner. The mass data storage 446 may include magnetic storage devices for example hard disk drives HDD. The powertrain control system 432 may be connected to memory 447 such as RAM, ROM, low latency nonvolatile memory such as flash memory and/or other suitable electronic data storage. The powertrain control system 432 also may support connections with a wired or wireless LAN via a LAN network interface 448. A wired connection would be suitable for use in a diagnostic capacity while servicing the vehicle.

Figure 8D:
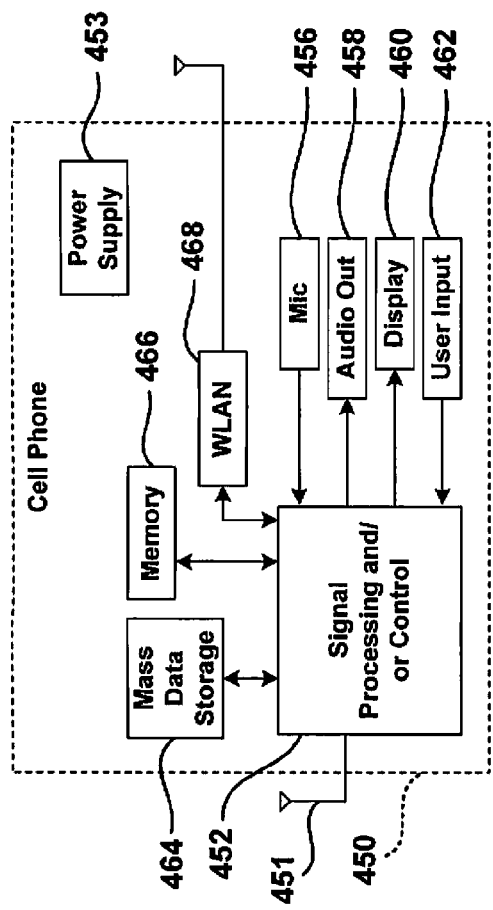
FIG. 8D is a functional block diagram of a cellular phone.

Referring now to FIG. 8D, the device can be implemented in a wireless local area network interface 468 of a cellular phone 450. The phone 450 may include a cellular antenna 451. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices, for example, a hard disk drive HDD. The cellular phone 450 may be connected to memory 466 such as RAM, ROM, low latency nonvolatile memory such as flash memory and/or other suitable electronic data storage. The cellular phone 450 also may support connections with a WLAN via the WLAN interface 468 using the transmitter technology described above.

Figure 8E:
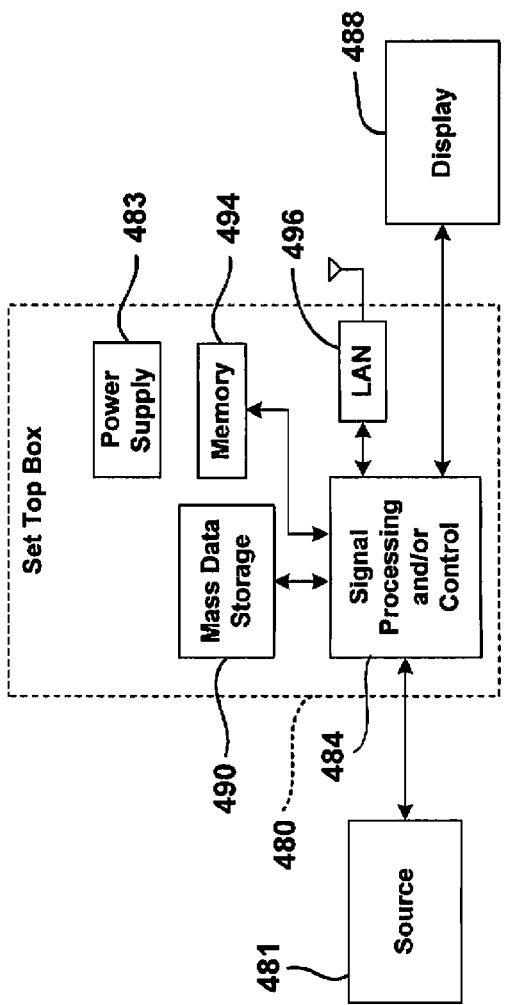
FIG. 8E is a functional block diagram of a set top box.

Referring now to FIG. 8E, the device can be implemented in a wired or wireless LAN interface 496 of a set top box 480. The LAN interface 496 may include the transmitter corresponding to the above embodiments. The set top box 480 receives wired or wireless signals from a source 481 such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDDs. The set top box 480 may be connected to memory 494 such as RAM, ROM, low latency nonvolatile memory such as flash memory and/or other suitable electronic data storage.

Figure 8F:
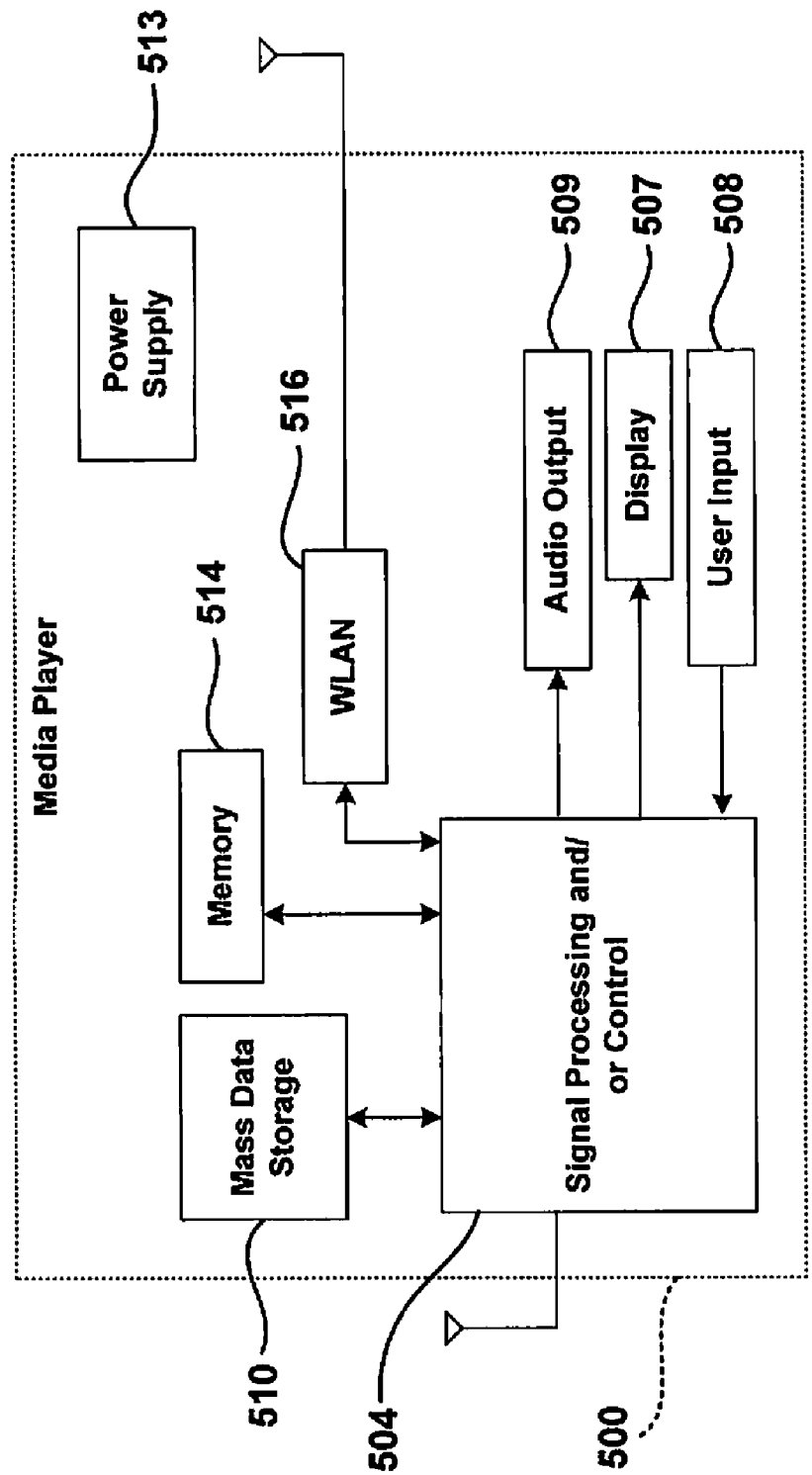
FIG. 8F is a functional block diagram of a media player.

Referring now to FIG. 8F, the device can be implemented in a wired or wireless LAN interface of a media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The media player 500 may be connected to memory 514 such as RAM, ROM, low latency nonvolatile memory such as flash memory and/or other suitable electronic data storage. The media player 500 also may support connections with a wired or wireless LAN via a LAN network interface 516 using the transmitter module described above in FIGS. 4-6. Still other implementations in addition to those described above are contemplated.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A noise-shaping module, comprising:
   a first addition module configured to receive a digital input signal and a filtered output signal;
   a truncation module configured to i) remove selected bits from the digital input signal and ii) output a truncated output signal, wherein the truncated output signal corresponds to the digital input signal with the selected bits removed;
   a second addition module configured to output a difference signal, wherein the difference signal is based on a difference between the digital input signal and the truncated output signal; and
   a filter module configured to i) generate the filtered output signal based on the difference signal, ii) provide the filtered output signal to the first addition module, and iii) suppress quantization noise more in frequency bands corresponding to small attenuation and less in frequency bands corresponding to large attenuation.

2. The noise-shaping module of claim 1, wherein i) the filter module is configured to operate according to a transfer function, and ii) the transfer function is based on different attenuation levels associated with respective frequency bands of a communication channel.

3. The noise-shaping module of claim 2, wherein the different attenuation levels are associated with the respective frequency bands to suppress the quantization noise.

4. A noise-shaping module, comprising:
   a first addition module configured to receive a digital input signal and a filtered output signal;
   a truncation module configured to i) remove selected bits from the digital input signal and ii) output a truncated output signal, wherein the truncated output signal corresponds to the digital input signal with the selected bits removed;

a second addition module configured to output a difference signal, wherein the difference signal is based on a difference between the digital input signal and the truncated output signal; and a filter module configured to i) generate the filtered output signal based on the difference signal and ii) provide the filtered output signal to the first addition module, wherein i) the filter module is configured to operate according to a transfer function, and ii) the transfer function is based on different attenuation levels associated with respective frequency bands of a communication channel, wherein the different attenuation levels are associated with the respective frequency bands to suppress quantization noise, and wherein the quantization noise is suppressed i) more in frequency bands corresponding to small attenuation and ii) less in frequency bands corresponding to large attenuation.

5. A transmitter comprising the noise-shaping module of claim 1.

6. A system comprising the transmitter of claim 5, and further comprising:

a digital-to-analog converter (DAC) configured to i) convert the truncated output signal to an analog output signal, and ii) provide the analog output signal to a communication channel; and a receiver configured to receive the analog output signal from the communication channel.

7. The system of claim 6, wherein quantization noise of the DAC is equalized in a frequency domain.

8. A noise-shaping method, comprising:

receiving a digital input signal and a filtered output signal;

removing selected bits from the digital input signal to generate a truncated output signal, wherein the truncated output signal corresponds to the digital input signal with the selected bits removed;

generating a difference signal, wherein the difference signal is based on a difference between the digital input signal and the truncated output signal;

suppressing quantization noise more in frequency bands corresponding to small attenuation;

suppressing the quantization noise less in frequency bands corresponding to large attenuation;

generating the filtered output signal based on the difference signal; and transmitting the truncated output signal.

9. The method of claim 8, further comprising:

generating the filtered output signal according to a transfer function, wherein the transfer function is based on different attenuation levels associated with respective frequency bands of a communication channel.

10. The method of claim 9, wherein the different attenuation levels are associated with the respective frequency bands to suppress the quantization noise.

11. A noise-shaping method, comprising:

receiving a digital input signal and a filtered output signal;

removing selected bits from the digital input signal to generate a truncated output signal, wherein the truncated output signal corresponds to the digital input signal with the selected bits removed;

generating a difference signal, wherein the difference signal is based on a difference between the digital input signal and the truncated output signal;

generating the filtered output signal based on the difference signal;

transmitting the truncated output signal;

generating the filtered output signal according to a transfer function, wherein the transfer function is based on different attenuation levels associated with respective frequency bands of a communication channel, wherein the different attenuation levels are associated with the respective frequency bands to suppress quantization noise;

suppressing the quantization noise more in frequency bands corresponding to small attenuation; and suppressing the quantization noise less in frequency bands corresponding to large attenuation.

12. The method of claim 8, further comprising:

converting the truncated output signal to an analog output signal using a digital-to-analog converter (DAC); and providing the analog output signal to a communication channel.

13. The method of claim 12, wherein quantization noise of the DAC is equalized in a frequency domain.

* * * * *